(12) United States Patent
Lin et al.

(10) Patent No.: US 10,132,970 B2
(45) Date of Patent: Nov. 20, 2018

(54) COLOR FILTER DEVICE AND FORMING METHOD THEREOF

(71) Applicant: UNITED MICROELECTRONICS CORP., Hsin-Chu (TW)

(72) Inventors: Chih-Yun Lin, Hsinchu (TW); Wei-Ming Ruan, Hsinchu County (TW)

(73) Assignee: UNITED MICROELECTRONICS CORP., Hsin-Chu (TW)

( * ) Notice: Subject to any disclaimer, the term of this patent is extended or adjusted under 35 U.S.C. 154(b) by 134 days.

(21) Appl. No.: 15/297,150

(22) Filed: Oct. 19, 2016

(65) Prior Publication Data

US 2018/0067241 A1    Mar. 8, 2018

(30) Foreign Application Priority Data

Sep. 2, 2016    (TW) .............................. 105128382 A

(51) Int. Cl.
*H01L 27/146* (2006.01)
*G02B 5/20* (2006.01)
*G01J 1/04* (2006.01)

(52) U.S. Cl.
CPC ............ *G02B 5/201* (2013.01); *G01J 1/0488* (2013.01); *H01L 27/1464* (2013.01); *H01L 27/14621* (2013.01); *H01L 27/14645* (2013.01); *H01L 27/14685* (2013.01)

(58) Field of Classification Search
CPC .................... H01L 27/14621; H01L 27/14636
See application file for complete search history.

(56) References Cited

U.S. PATENT DOCUMENTS

| 8,144,270 B2 | 3/2012 | Wang | |
| 2009/0032895 A1* | 2/2009 | Park | H01L 27/14627 257/432 |
| 2017/0358620 A1* | 12/2017 | Chen | H01L 27/14643 |

* cited by examiner

*Primary Examiner* — Thanh Luu
(74) *Attorney, Agent, or Firm* — Winston Hsu

(57) ABSTRACT

A color filter device includes a dielectric layer, a passivation layer, a plurality of color filters and an inorganic film. The dielectric layer is disposed on a substrate, wherein the substrate has a light sensing area and a periphery area, and the periphery area is beside the light sensing area. The passivation layer is disposed on the dielectric layer, wherein the passivation layer has a recess. The color filters are disposed on the passivation layer and beside the recess. The inorganic film is disposed in the recess. The present invention also provides a method for forming said color filter device.

20 Claims, 5 Drawing Sheets

COLOR FILTER DEVICE AND FORMING METHOD THEREOF

BACKGROUND OF THE INVENTION

1. Field of the Invention

The present invention relates generally to a color filter device and forming method thereof, and more specifically to a color filter device and forming method thereof that embeds an inorganic film beside color filters into a passivation layer below the color filters.

2. Description of the Prior Art

CMOS image sensors (CIS) are based on CMOS technologies, so the CMOS image sensors are compatible with the typical CMOS fabrication processes. They integrate additional signal processing logic elements on a same substrate, wherein it is possible to dispose sensor arrays. Thus, CMOS image sensors (CIS) are widely used.

An image sensor may be divided into function areas, such as a light sensing area and a peripheral electronic circuit area. The light sensing area includes a plurality of photodiodes arranged in an array, and MOS transistors for sensing the light intensity, i.e. a reset transistor, a current source follower and a row selector. The peripheral electronic circuit area connects interconnects to external connections. A main function of the image sensor is to divide incident light beams into combinations of light beams of different wavelengths. The light is received by a plurality of imaging devices on the semiconductor substrate and transformed into digital signals of different intensities. For instance, an incident beam is divided into a combination of red, green and blue light and then received by corresponding photodiodes. Each photodiode transforms the light intensity into digital signals.

Some of the CIS systems use the Front Side Illumination (FSI) technology to form the pixels of a pixel array. In FSI CMOS image sensors, light is transmitted to a photo-sensing area through the front side of the pixel. This means that the incident light has to pass through dielectric layers, and metal layers before it reaches the photo-sensing area. Some of the CIS systems use the Back Side Illumination (BSI) instead.

There must be color filters accompanying with photodiodes to achieve image sensing function in both kinds of said image sensors. The relative positions of the color filters and other components would affect the light sensing efficiency of a formed image sensor.

SUMMARY OF THE INVENTION

The present invention provides a color filter device and forming method thereof, which embeds an inorganic film beside color filters into a passivation layer below the color filters, thereby the color filters having uniform thicknesses can be formed.

The present invention provides a color filter device including a dielectric layer, a passivation layer, a plurality of color filters and an inorganic film. The dielectric layer is disposed on a substrate, wherein the substrate has a light sensing area and a periphery area, and the periphery area is beside the light sensing area. The passivation layer is disposed on the dielectric layer, wherein the passivation layer has a recess. The color filters are disposed on the passivation layer and beside the recess. The inorganic film is disposed in the recess.

The present invention provides a method of forming a color filter device including the following steps. A substrate is provided, wherein the substrate has a light sensing area and a periphery area, and the periphery area is located beside the light sensing area. A dielectric layer is formed on the substrate. A passivation layer is formed on the dielectric layer. A recess is formed in the passivation layer. An inorganic film is formed in the recess. After forming the inorganic film, a plurality of color filters are formed on the passivation layer and beside the inorganic film.

According to the above, the present invention provides a color filter device and forming method thereof, which embeds an inorganic film beside color filters into a passivation layer. Moreover, the inorganic film would extend into a part of the dielectric layer below the passivation layer. Therefore, the high difference between the color filters and the inorganic film can be reduced. Hence, the gap between the color filters and the inorganic film can be decreased, and thus the size of the formed color filter device can be shrunk.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
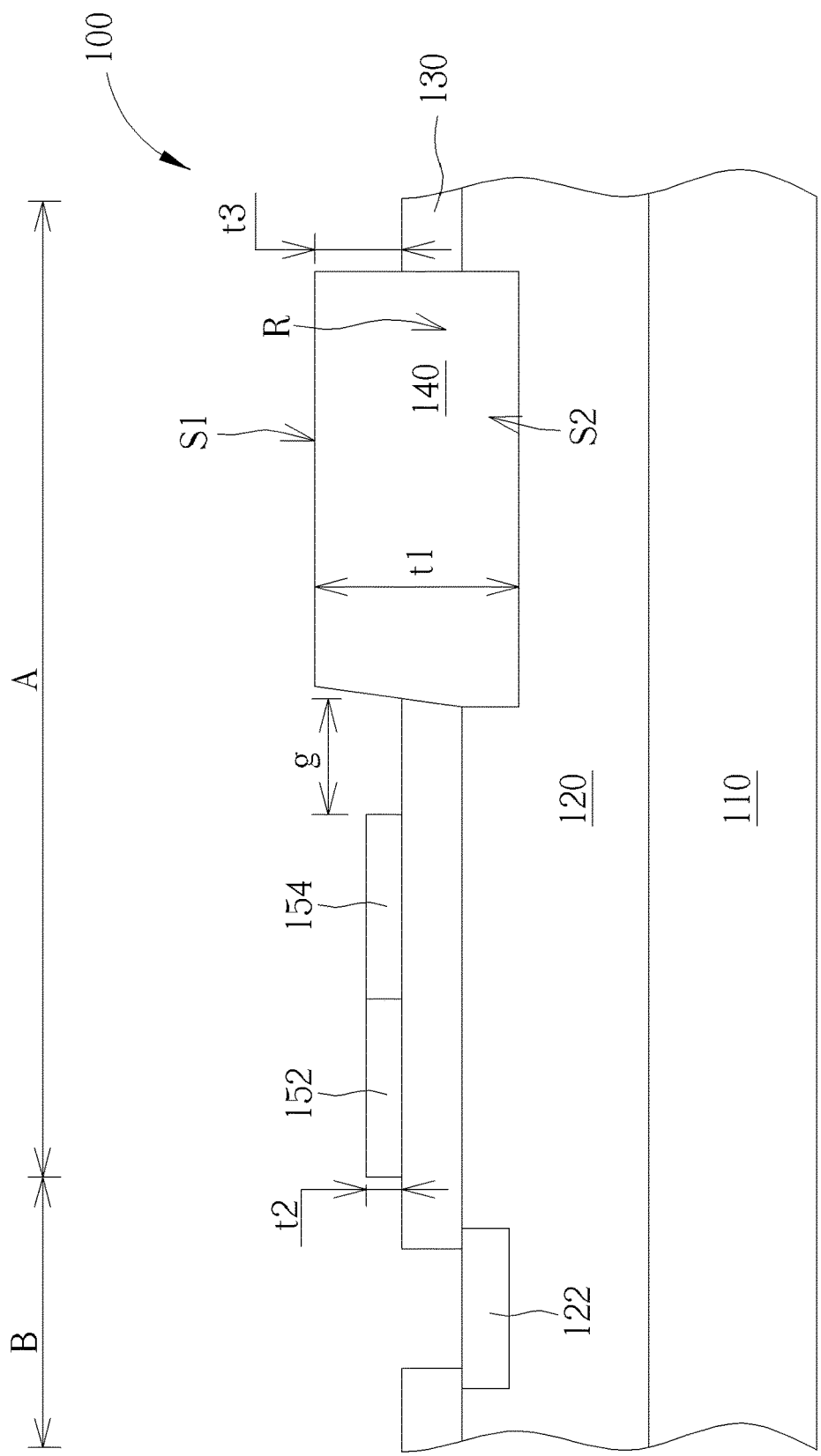
FIG. 1 schematically depicts a cross-sectional view of a color filter device according to an embodiment of the present invention.
Figure 2:
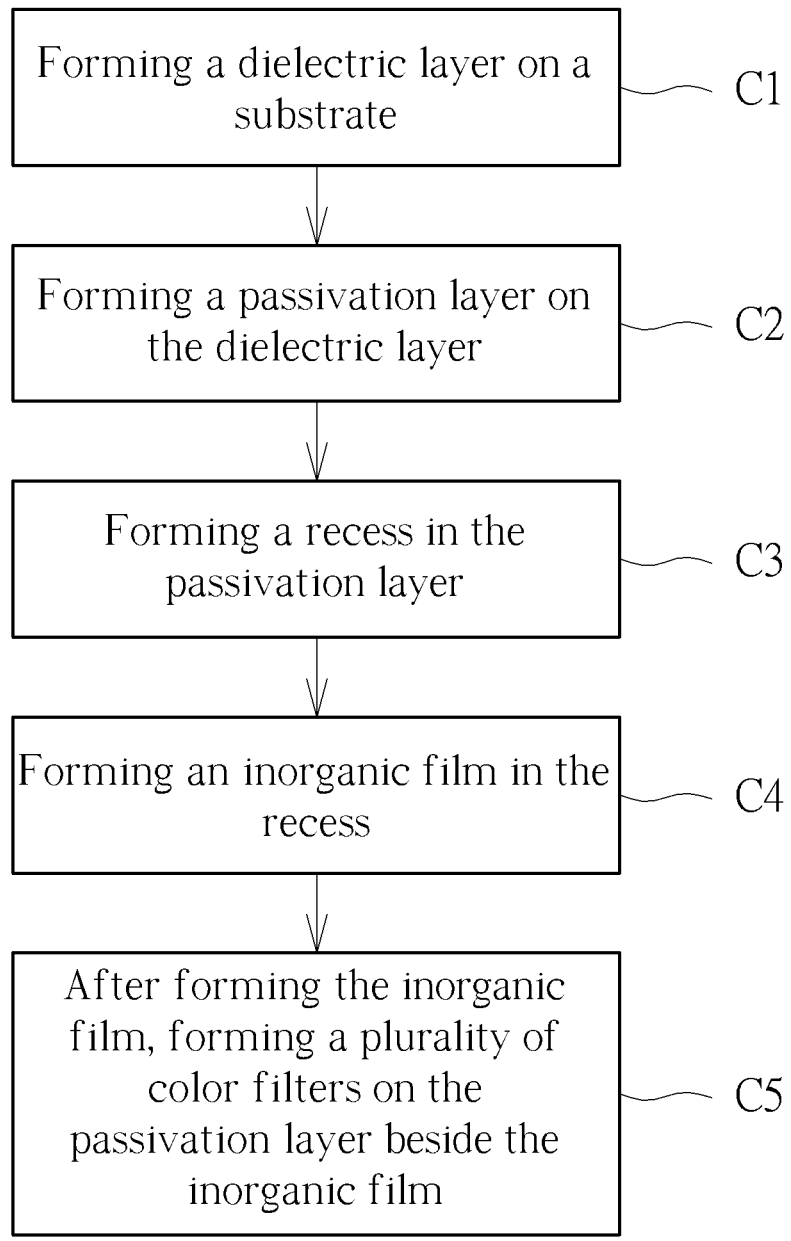
FIG. 2 schematically depicts a flow chart of a color filter device forming process according to an embodiment of the present invention.
Figure 3:
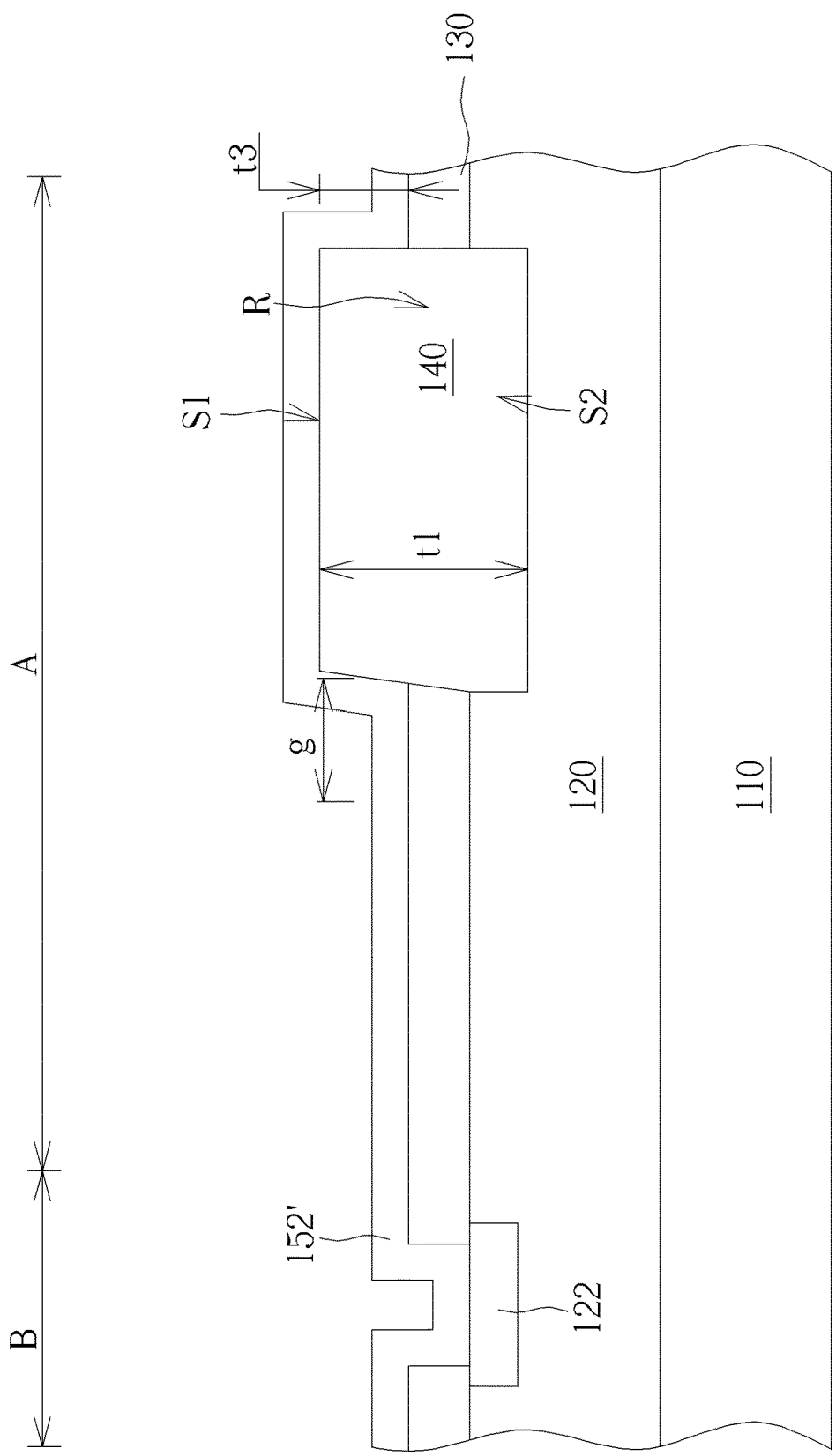
FIG. 3 schematically depicts a cross-sectional view of a color filter device forming process according to an embodiment of the present invention.
Figure 4:
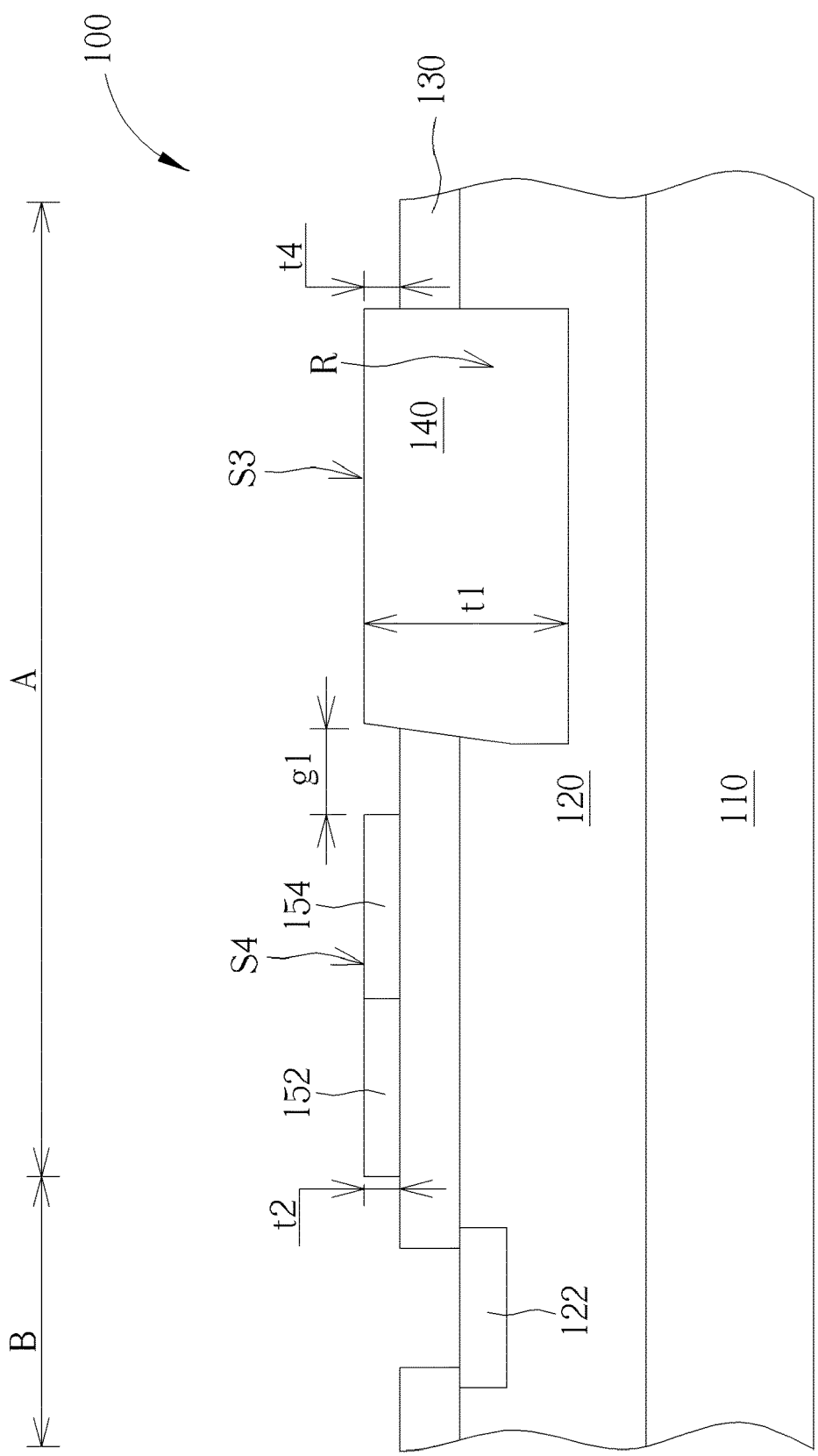
FIG. 4 schematically depicts a cross-sectional view of a color filter device according to another embodiment of the present invention.
Figure 5:
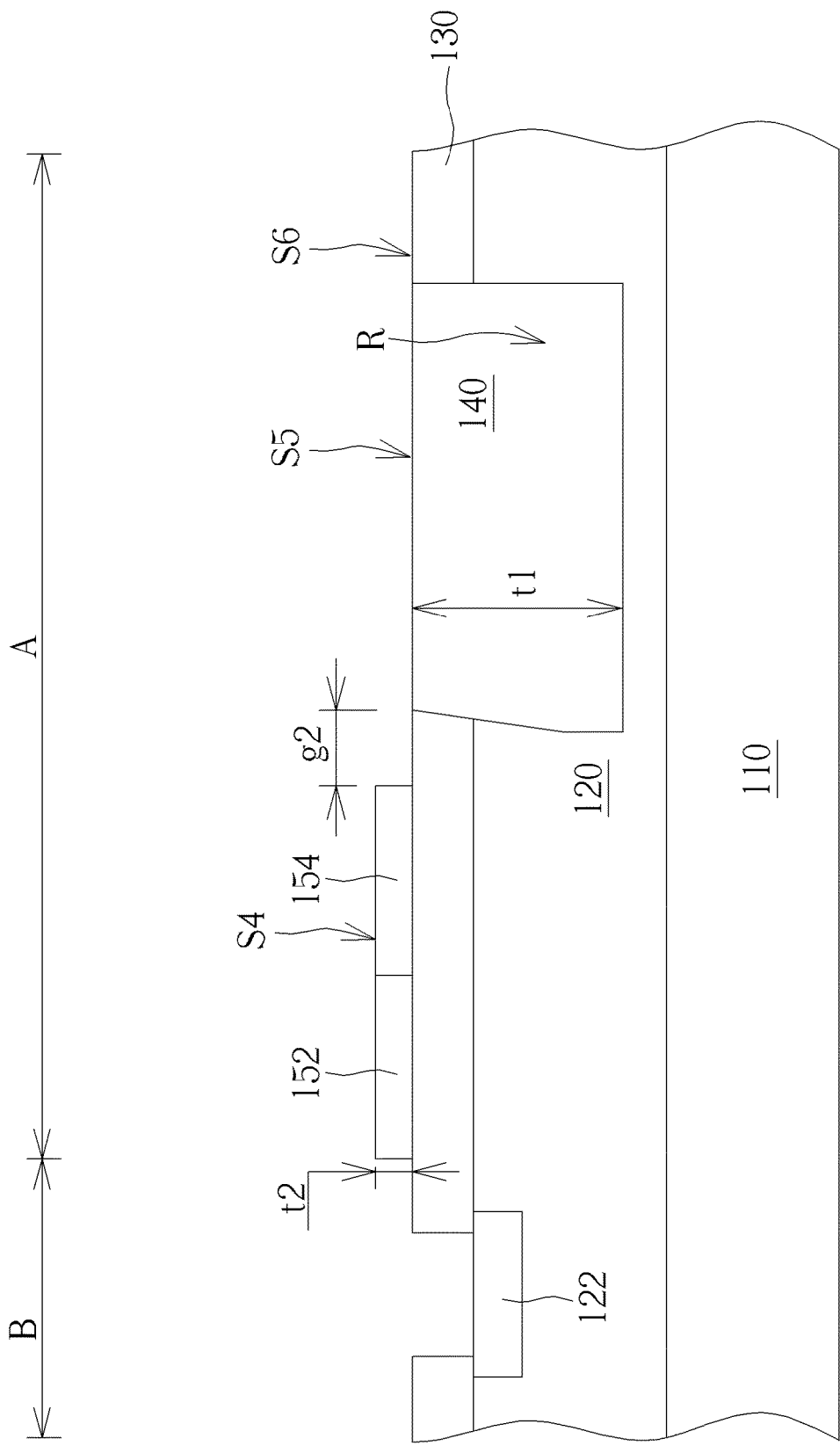
FIG. 5 schematically depicts a cross-sectional view of a color filter device according to still another embodiment of the present invention.

FIG. 1 schematically depicts a cross-sectional view of a color filter device according to an embodiment of the present invention. FIG. 2 schematically depicts a flow chart of a color filter device forming process according to an embodiment of the present invention. FIG. 3 schematically depicts a cross-sectional view of a color filter device forming process according to an embodiment of the present invention. FIG. 4 schematically depicts a cross-sectional view of a color filter device according to another embodiment of the present invention. FIG. 5 schematically depicts a cross-sectional view of a color filter device according to still another embodiment of the present invention. The structures of FIGS. 1,3-5 can be formed by the color filter device forming process of FIG. 2, but it is not limited thereto.

As shown in FIG. 1, a substrate 110 may be provided. The substrate 110 may be a semiconductor substrate such as a silicon substrate, a silicon containing substrate, a III-V group-on-silicon (such as GaN-on-silicon) substrate, a graphene-on-silicon substrate or a silicon-on-insulator (SOI) substrate. The substrate 110 may include a light sensing area A and a periphery area B, and the periphery area B is located beside the light sensing area A, wherein light signals are transformed into digital signals in the light sensing area A, and the periphery area B connects the digital signals to external circuits. An isolation structure (not shown) may be optionally formed in the substrate 110 to electrically isolate areas or transistors from each other. The isolation structure (not shown) may be a shallow trench isolation (STI) structure, which may be formed by a shallow trench isolation (STI) process, but it is not limited thereto. The forming methods are known in the art and are not described herein. A plurality of photodiodes (not shown) are formed on the substrate 110 of the light sensing area A. Later formed color filters are disposed corresponding to the photodiodes. Transistors (not shown) may be formed on the substrate 110.

Please refer to Step C1 of FIG. 2—forming a dielectric layer on a substrate. A dielectric layer 120 is formed on the substrate 110. In this embodiment, the dielectric layer 120 may include an inter-metal dielectric (IMD) layer, which may be an oxide layer. An inter-layer dielectric (ILD) layer may be formed between the dielectric layer 120 and the substrate 110, so that said photodiodes and said transistors may be formed in the inter-layer dielectric (ILD) layer, and being electrically connected to external circuits through metal interconnect structures in the dielectric layer 120, but it is not limited thereto. In this embodiment, the dielectric layer 120 is a three-layer inter-metal dielectric (IMD) layer with a thickness of 50000 angstroms, but it is not limited thereto. In another embodiment, the dielectric layer 120 may be one single layer with a thickness of 16667 angstroms, depending upon practical requirements. Since the dielectric layer 120 is an inter-metal dielectric (IMD) layer, metal interconnect structures may be formed therein. FIG. 1 only depicts one metal interconnect structure 122, but it is not limited thereto. The metal interconnect structure 122 may be a pad formed in the periphery area B and connects external circuits. FIG. 1 only depicts the metal interconnect structure 122 in the periphery area B, but other metal interconnect structures may be formed in the light sensing area A.

Please refer to Step C2 of FIG. 2—forming a passivation layer on the dielectric layer. A passivation layer 130 is formed on the dielectric layer 120. The passivation layer 130 may be an oxide/nitride layer with a thickness of 9000 angstroms, but it is not limited thereto. The passivation layer 130 may be a nitride layer instead. The passivation layer 130 may be formed by methods such as blanketly covering a passivation material, and then patterning the passivation material by photolithography to expose the metal interconnect structure 122, thereby the passivation layer 130 being formed. In this embodiment, only the passivation layer 130 is etched to expose at least a part of the metal interconnect structure 122 for being as a bonding pad, but the metal interconnect structure 122 and the dielectric layer 120 are not etched. The etching of the passivation layer 130 may be carried out by an etching process having etching selectivity to the passivation layer 130 and to the metal interconnect structure 122 and the dielectric layer 120, but it is not limited thereto.

Please refer to Step C3 of FIG. 2—forming a recess in the passivation layer. A recess R is formed in the passivation layer 130. In this embodiment, the recess R penetrates through the passivation layer 130 till the dielectric layer 120, but it is not limited thereto. In other embodiments, the recess R may be only in the passivation layer 130 without penetrating through the passivation layer 130 till the dielectric layer 120. In some cases, the recess R may penetrate through the passivation layer 130 till the dielectric layer 120, and in a part of the dielectric layer 120. Thereby, height difference between a later formed inorganic film and later formed color filters can be decreased. For forming the recess R penetrating through the passivation layer 130 till the dielectric layer 120 without in the dielectric layer 120, an etching process having an etching rate to the passivation layer 130 larger than an etching rate to the dielectric layer 120 may be processed, thereby only the passivation layer 130 being etched or the passivation layer 130 may being penetrated without over-etching the dielectric layer 120. For forming the recess R penetrating through the passivation layer 130 and in a part of the dielectric layer 120, an etching process having non-etching selectivity to the passivation layer 130 and the dielectric layer 120 may be processed, thereby the passivation layer 130 and the dielectric layer 120 can be etched with the same etching rate, but it is not limited thereto. The dielectric layer 120 may be a three-layer inter-metal dielectric (IMD) layer, and a bottom surface of the recess R can trim one of the three layers, thereby the depth of the recess R can be controlled by the three layers of the dielectric layer 120.

Please refer to Step C4 of FIG. 2—forming an inorganic film in the recess. An inorganic film 140 is formed in the recess R. The inorganic film 140 may be a titanium dioxide ($TiO_2$) layer, a spin on glass (SOG) layer, a field oxide spin on glass (SOG) layer, a plasma-enhanced oxide tetraethoxysilane layer or their combinations. The inorganic film 140 may be formed by a spin coating process or a plasma-enhanced chemical vapor deposition (PECVD) process, but it is not limited thereto. The inorganic film 140 is capable of light reflection, light filtering or others, thus can be used for light sensing while being accompanied with other components. Every pixels can be separated by the inorganic film 140, or the whole color filters can be surrounded by the inorganic film 140, depending upon practical requirements.

Please refer to Step C5 of FIG. 2—after forming the inorganic film, forming a plurality of color filters on the passivation layer beside the inorganic film. After the inorganic film 140 is formed, a plurality of color filters 152/154 are formed on the passivation layer 130 beside the inorganic film 140 to constitute a color filter array. The color filters 152/154 may be composed of organic materials formed by a spin coating process, but it is not limited thereto. As shown in FIG. 3, the method of forming the color filter 152 may include conformally covering a color filter material 152' on the passivation layer 130 and the inorganic film 140, and then removing the color filter material 152' on the inorganic film 140 and on a part of the passivation layer 130. The method of forming the color filter 154 may be common to this method. The order of forming the color filters 152/154 and the number of the color filters 152/154 depends upon practical requirements. There are two color filters depicted in FIG. 2, but the color filters may include a color filter array composed of a color filter, a green color filter and a blue color filter, or etc. In this embodiment, the color filters 152/154 are disposed close to each other, and the color filter 152 directly contacts the color filter 154. A gap g is between the inorganic film 140 and the color filter 154 without the inorganic film 140 directly contacting the color filter 154.

In this embodiment, the gap g between the color filters 152/154 and inorganic film 140 is less than 50 micrometers (um), the thickness of the color filters is 8000-12000 angstroms, and the thickness of the inorganic film 140 is 40000-70000 angstroms. As a thickness t1 of the inorganic film 140 is 50000 angstroms and a thickness t2 of the color filters 152/154 is 1000 angstroms, the height difference between the color filters 152/154 and the inorganic film 140 is less than 40000 angstroms because of the inorganic film 140 embedding into the passivation layer 130. Thereby, the gap g between the color filters 152/154 and the inorganic film 140 can be less than 50 micrometers (um). Compared to a case of the inorganic film 140 being directly disposed on the passivation layer 130, meaning the thickness t1 of the inorganic film 140 is 50000 angstroms, the thickness t2 of the color filters 152/154 is 1000 angstroms, and the height difference between both is 40000 angstroms, the gap g between the color filters 152/154 and the inorganic film 140 of the present invention can be less. As the height difference between the color filters 152/154 and the inorganic film 140 is larger, the gap g between the color filters 152/154 and the inorganic film 140 must be larger as well for coating the color filter material 152' uniformly and forming the color filters 152/154 having uniform thicknesses t2. In other words, the height difference between the color filters 152/154 and the inorganic film 140 can be reduced by setting a top surface S1 of the inorganic film 140 protruding from a thickness t3 of the passivation layer 130, and a bottom part S2 of the inorganic film 130 in the passivation layer 130. Hence, the gap g between the color filters 152/154 and the inorganic film 140 can be reduced, and the size of a formed color filter device 100 can be shrunk.

As shown in a preferred embodiment of FIG. 4, a thickness t1 of the inorganic film 140 is 50000 angstroms, a thickness t2 of the color filters 152/154 is 1000 angstroms, and a thickness t4 of the inorganic film 140 protruding from the passivation layer 130 is only 10000 angstroms. Thus, a top surface S3 of the inorganic film 140 trims top surfaces S4 of the color filters 152/154, thereby a gap g1 between the color filters 152/154 and the inorganic film 140 can be less than 10 micrometers (um). However, in other cases, the gap g1 between the color filters 152/154 and the inorganic film 140 may be 10 micrometers (um), and the thickness of the color filters 152/154 may be 8000-12000 angstroms while the thickness t4 of the inorganic film 140 protruding from the passivation layer 130 is 40000-70000 angstroms.

As shown in a preferred embodiment of FIG. 5, a thickness t1 of the inorganic film 140 is 50000 angstroms, a thickness t2 of the color filters 152/154 is 1000 angstroms, and the whole inorganic film 140 is embedded into the passivation layer 130. Thus, a top surface S5 of the inorganic film 140 trims a top surface S6 of the passivation layer 130, the top surfaces S4 of the color filters 152/154 are higher than the top surface S5 of the inorganic film 140, and a gap g2 between the color filters 152/154 and the inorganic film 140 can approach micrometers (um), depending upon practical requirements. Furthermore, microlens (not shown) may be disposed on the color filters 152/154 and optionally disposed on the inorganic film 140.

To summarize, the present invention provides a color filter device and forming method thereof, which embeds an inorganic film beside color filters into a passivation layer. Moreover, the inorganic film may extend into a part of the dielectric layer below the passivation layer while all of the color filters are disposed on the passivation layer. Therefore, the high difference between the color filters and the inorganic film can be reduced. Hence, the gap between the color filters and the inorganic film can be decreased, and thus the size of the formed color filter device can be shrunk.

Moreover, the inorganic film may be formed only in a top part of the passivation layer, penetrates through the passivation layer, or penetrates through the passivation layer and extends to the dielectric layer below the passivation layer, depending upon desired height difference between the color filters and inorganic film and the thicknesses of the inorganic film or/and the dielectric layer. Thus, a top surface of the inorganic film may protrude from the passivation layer and a bottom part of the inorganic film is disposed in the passivation layer. In one case, the top surface of the inorganic film may trim top surfaces of the color filters. Preferably, the top surface of the inorganic film trims a top surface of the passivation layer, meaning the whole inorganic film is embedded into the passivation layer. Therefore, a color filter material can be coated flat, and thus the color filters having a uniform thickness can be formed.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A color filter device, comprising:
a dielectric layer disposed on a substrate, wherein the substrate has a light sensing area and a periphery area, and the periphery area is located beside the light sensing area;
a passivation layer disposed on the dielectric layer, wherein the passivation layer has a recess;
a plurality of color filters disposed on the passivation layer and beside the recess; and
an inorganic film containing oxide disposed in the recess, wherein the inorganic film fills up the recess.

2. The color filter device according to claim 1, wherein the dielectric layer comprises an inter-metal dielectric (IMD) layer.

3. The color filter device according to claim 1, wherein the passivation layer comprises an oxide/nitride layer.

4. The color filter device according to claim 1, wherein the dielectric layer has a metal interconnect structure therein and the metal interconnect structure is located in the periphery area, the color filters and the inorganic film are disposed in the light sensing area, wherein light signals are transformed into digital signals in the light sensing area, and the periphery area connects the digital signals to external circuits.

5. The color filter device according to claim 1, wherein the gap between the color filters and the inorganic film is less than 50 micrometers (um), the thickness of the color filters is 8000-12000 angstroms, and the thickness of the inorganic film is 40000-70000 angstroms.

6. The color filter device according to claim 1, wherein the recess penetrates through the passivation layer and extends to at least a part of the dielectric layer.

7. The color filter device according to claim 6, wherein the recess penetrates through the passivation layer and extends to at least a part of the dielectric layer, and is located in a part of the dielectric layer.

8. The color filter device according to claim 1, wherein a top surface of the inorganic film and a top surface of the passivation layer constitute one same planar.

9. The color filter device according to claim 1, wherein a top surface of the inorganic film protrudes from the passivation layer, and a bottom part of the inorganic film is located in the passivation layer.

10. The color filter device according to claim 9, wherein a top surface of the inorganic film and top surfaces of the color filters constitute one same planar.

11. The color filter device according to claim 10, wherein the gap between the color filters and the inorganic film is 10 micrometers (um), the thickness of the color filters is 8000-12000 angstroms, and the thickness of the inorganic film protruding from the passivation layer is 40000-70000 angstroms.

12. A method of forming a color filter device, comprising:
providing a substrate, wherein the substrate has a light sensing area and a periphery area, and the periphery area is located beside the light sensing area;
forming a dielectric layer on the substrate;
forming a passivation layer on the dielectric layer;
forming a recess in the passivation layer;
forming an inorganic film containing oxide in the recess, wherein the inorganic film fills up the recess; and
after forming the inorganic film, forming a plurality of color filters on the passivation layer and beside the inorganic film.

13. The method of forming a color filter device according to claim 12, wherein the method of forming the plurality of color filters comprise:
conformally covering a color filter material on the passivation layer and the inorganic film; and
removing the color filter material directly on the inorganic film and a part of the passivation layer to form the color filters.

14. The method of forming a color filter device according to claim 12, wherein the gap between the color filters and the inorganic film is less than 50 micrometers (um), the thickness of the color filters is 8000-12000 angstroms, and the thickness of the inorganic film is 40000-70000 angstroms.

15. The method of forming a color filter device according to claim 12, wherein the color filters and the inorganic film are located in the light sensing area, and the method of forming the color filter device further comprises:
forming a metal interconnect structure in the dielectric layer and in the periphery area before the passivation layer is formed on the dielectric layer.

16. The method of forming a color filter device according to claim 12, wherein the recess penetrates through the passivation layer and extends to at least a part of the dielectric layer, and the recess is formed by an etching process, wherein the etching rate of the etching process to the passivation layer is larger than the etching rate of the etching process to the dielectric layer.

17. The method of forming a color filter device according to claim 12, wherein the recess penetrates through the passivation layer and extends to at least a part of the dielectric layer and is located in a part of the dielectric layer, and the recess is formed by an etching process, wherein the etching rate of the etching process to the passivation layer is equal to the etching rate of the etching process to the dielectric layer.

18. The method of forming a color filter device according to claim 12, wherein a top surface of the inorganic film and a top surface of the passivation layer constitute one same planar.

19. The method of forming a color filter device according to claim 12, wherein a top surface of the inorganic film protrudes from the passivation layer, and a bottom part of the inorganic film is located in the passivation layer.

20. The method of forming a color filter device according to claim 19, wherein a top surface of the inorganic film and top surfaces of the color filters constitute one same planar.

* * * * *